(12) United States Patent
Zang et al.

(10) Patent No.: US 10,825,910 B1
(45) Date of Patent: Nov. 3, 2020

(54) SHAPED GATE CAPS IN DIELECTRIC-LINED OPENINGS

(71) Applicant: GLOBALFOUNDRIES Inc., Grand Cayman (KY)

(72) Inventors: Hui Zang, Guilderland, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/386,545

(22) Filed: Apr. 17, 2019

(51) Int. Cl.
| | |
|---|---|
| *H01L 29/82* | (2006.01) |
| *H01L 29/423* | (2006.01) |
| *H01L 21/28* | (2006.01) |
| *H01L 21/8234* | (2006.01) |
| *H01L 21/321* | (2006.01) |
| *H01L 29/78* | (2006.01) |
| *H01L 29/06* | (2006.01) |
| *H01L 21/768* | (2006.01) |

(52) U.S. Cl.
CPC .. *H01L 29/42376* (2013.01); *H01L 21/28008* (2013.01); *H01L 21/3212* (2013.01); *H01L 21/76831* (2013.01); *H01L 21/823431* (2013.01); *H01L 21/823437* (2013.01); *H01L 21/823468* (2013.01); *H01L 29/0649* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 6,159,781 A | 12/2000 | Pan et al. | |
| 9,337,099 B1 | 5/2016 | Jain et al. | |
| 9,825,031 B1 | 11/2017 | Bouche et al. | |
| 2013/0187203 A1 | 7/2013 | Xie et al. | |
| 2014/0197468 A1* | 7/2014 | Xie | H01L 29/6656 257/288 |
| 2015/0287604 A1 | 10/2015 | Stephens et al. | |
| 2015/0380558 A1* | 12/2015 | Huang | H01L 29/66795 257/288 |
| 2017/0053804 A1* | 2/2017 | Lu | H01L 21/28132 |

OTHER PUBLICATIONS

Hui Zang et al., "Gate Contact and Cross-Coupling Contact Formation" filed Nov. 30, 2018 as U.S. Appl. No. 16/206,231.

\* cited by examiner

*Primary Examiner* — Moin M Rahman
(74) *Attorney, Agent, or Firm* — Thompson Hine LLP; Francois Pagette

(57) ABSTRACT

Structures for field effect-transistors and methods of forming field-effect transistors. A gate structure includes a gate electrode and a gate dielectric layer that are arranged between a first sidewall spacer and a second sidewall spacer. The gate structure has a top surface that is recessed relative to the first and second sidewall spacers. A gate cap is arranged over a section of the gate structure and over the first and sidewall spacers. The gate cap has a first section of a first width arranged over the section of the gate structure and a second section of a second width arranged over the section of the gate cap, the first sidewall spacer, and the second sidewall spacer. A dielectric liner is arranged between the gate cap and the gate structure, between the gate cap and the first sidewall spacer, and between the gate cap and the second sidewall spacer.

16 Claims, 12 Drawing Sheets

SHAPED GATE CAPS IN DIELECTRIC-LINED OPENINGS

BACKGROUND

The present invention relates to semiconductor device fabrication and integrated circuits and, more specifically, to structures for field effect-transistors and methods of forming field-effect transistors.

Contacts may provide vertical electrical connections extending to features of semiconductor devices, such as a gate structure of a field-effect transistor. Gate contacts are formed in contact openings that are constrained during etching by the configuration of adjacent structures, such as sidewall spacers and gate caps associated with the gate structures of the field-effect transistor. Gate caps may be formed by recessing the gate structure, depositing a dielectric material in the recess, and polishing the deposited dielectric material with a chemical-mechanical polishing process. Each gate contact is formed in an opening that is patterned in the gate cap over the gate structure.

Source/drain regions of the field-effect transistor are arranged adjacent to each gate structure and, prior to forming source/drain contacts, sections of an interlayer dielectric layer are arranged over the source/drain regions. The gate cap is typically composed of silicon nitride, and the interlayer dielectric layer is typically composed of silicon dioxide. Because of marginal selectivity of a chemical-mechanical polishing process between silicon dioxide and silicon nitride, the polishing process may exhibit marginal process control that can result in either unwanted overpolishing of the gate caps or unwanted underpolishing of the gate caps.

The formation of a gate contact requires the removal of the gate cap to expose a gate electrode of the underlying gate structure. The sidewall spacers may be composed of a low-k dielectric material. Due to poor etch selectivity between the silicon nitride of the gate cap and the low-k dielectric material of the sidewall spacers, the removal of the gate cap may result in unwanted pull-down of the sidewall spacers. The shortening of the sidewall spacers may result in shorting between the gate contact and source/drain regions or shorting between the gate contact and source/drain contacts coupled with the source/drain regions.

Improved structures for field effect-transistors and methods of forming field-effect transistors are needed.

SUMMARY

In an embodiment of the invention, a structure includes a first sidewall spacer, a second sidewall spacer, and a gate structure having a gate electrode and a gate dielectric layer that are arranged between the first sidewall spacer and the second sidewall spacer. The gate structure has a top surface that is recessed relative to the first sidewall spacer and the second sidewall spacer. A gate cap is arranged over a section of the gate structure, the first sidewall spacer, and the second sidewall spacer. The gate cap has a first section of a first width arranged over the section of the gate structure and a second section of a second width arranged over the first section of the gate cap, the first sidewall spacer, and the second sidewall spacer. A dielectric liner is arranged between the gate cap and the gate structure, between the gate cap and the first sidewall spacer, and between the gate cap and the second sidewall spacer.

In an embodiment of the invention, a method includes forming a gate structure including a gate electrode and a gate dielectric layer that are arranged between a first sidewall spacer and a second sidewall spacer. The method further includes recessing the first sidewall spacer and the second sidewall spacer relative to the gate structure, and recessing the gate electrode and the gate dielectric layer of the gate structure relative to the first sidewall spacer and the second sidewall spacer to define a cavity inside which a top surface of the gate structure is arranged below the first sidewall spacer and the second sidewall spacer. A dielectric liner is deposited inside the cavity and, after depositing the dielectric liner, a gate cap is formed inside the cavity. The dielectric liner is arranged between the gate cap and the gate structure, between the gate cap and the first sidewall spacer, and between the gate cap and the second sidewall spacer. A first section of the gate cap is arranged over a first section of the gate structure, and a second section of the gate cap is arranged over the first section of the gate cap, the first sidewall spacer, and the second sidewall spacer. The first section of the gate cap has a first width, and the second section of the gate cap has a second width.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
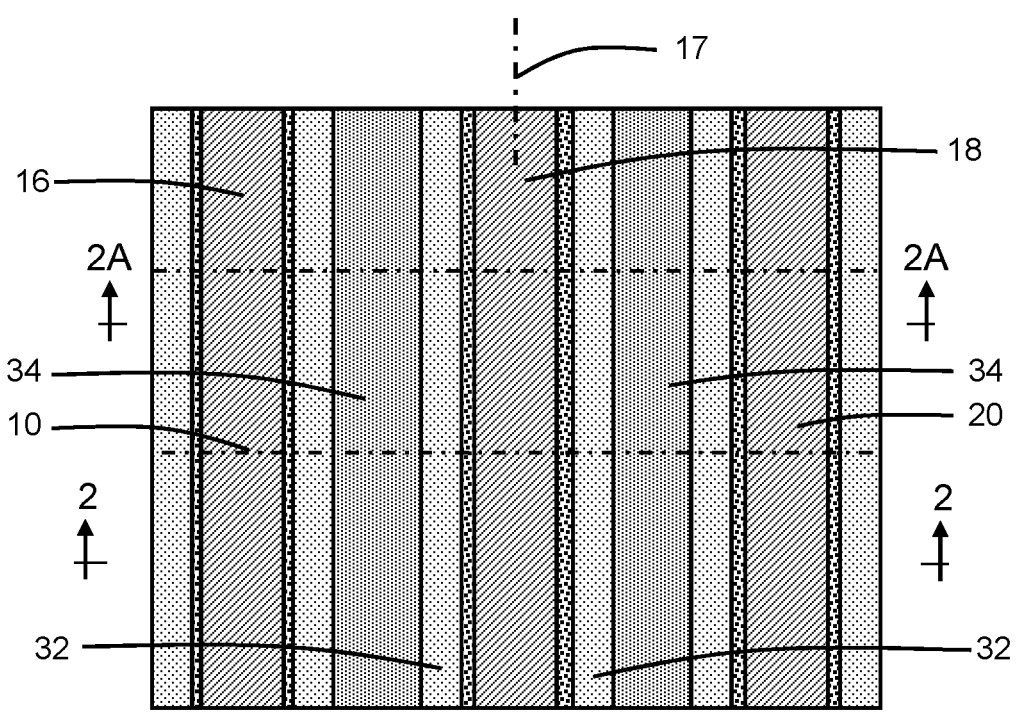
FIG. 1 is a top view of a structure at an initial fabrication stage of a processing method in accordance with embodiments of the invention.
Figure 2:
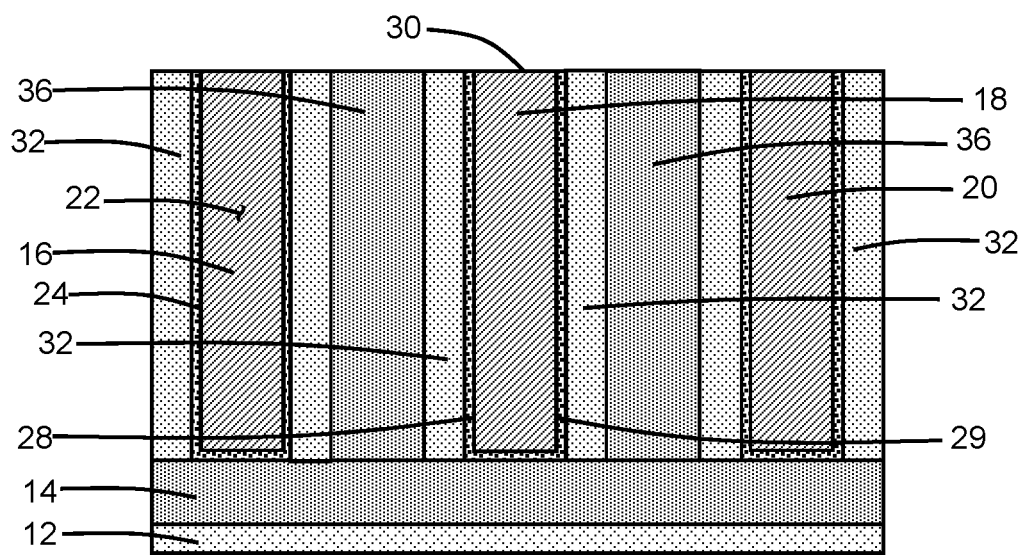
FIG. 2 is a cross-sectional view taken generally along line 2-2 in FIG. 1.
Figure 2A:
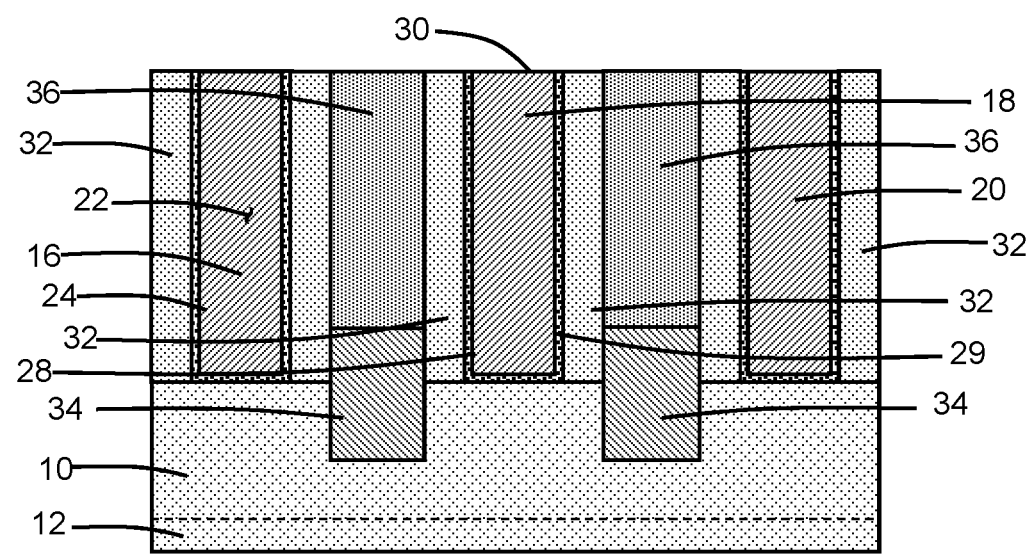
FIG. 2A is a cross-sectional view taken generally along line 2A-2A in FIG. 1.

With reference to FIGS. 1, 2, 2A and in accordance with embodiments of the invention, a fin 10 is formed that projects upwardly from a top surface of a substrate 12. The fin 10 may be formed by patterning the single-crystal semiconductor material (e.g., single-crystal silicon) of the substrate 12 with lithography and etching processes. A trench isolation region 14 may be formed that surrounds a lower portion of the fin 10. An upper portion of the fin 10 is arranged above a top surface of the trench isolation region 14. The trench isolation region 14 may be formed by depositing a layer composed of a dielectric material, such as silicon dioxide, and recessing the deposited layer with an etching process to expose an upper portion of the fin 10.

Gate structures 16, 18, 20 are formed that extend in part over the fin 10 and in part over the trench isolation region 14. Each of the gate structures 16, 18, 20 includes a gate electrode 22 and a gate dielectric layer 24 that is composed of a dielectric material, such as a high-k dielectric material like hafnium oxide. The gate electrode 22 may include one or more conformal barrier metal layers and/or work function metal layers, such as layers composed of titanium aluminum carbide and/or titanium nitride, and a metal gate fill layer composed of a conductor, such as tungsten. In an embodiment, the gate electrode 22 of the gate structures 16, 18, 20 may include conformal work function metal layers characteristic of a p-type field-effect transistor. In an embodiment, the gate electrode 22 of the gate structures 16, 18, 20 may include conformal work function metal layers characteristic of an n-type field-effect transistor. The gate structure 18 is aligned along a longitudinal axis 17, and the other gate structures 16 and 20 are similarly aligned along respective longitudinal axes that may be arranged substantially parallel to the longitudinal axis 17.

The gate electrode 22 of each of the gate structures 16, 18, 20 includes a side surface or sidewall 28 and a side surface or sidewall 29 that is opposite from the sidewall 28, as well as a top surface 30 that extends from the sidewall 28 to the sidewall 29. The sidewalls 28, 29 are covered by sections of the gate dielectric layer 24, and the top surface 30 is not covered by the gate dielectric layer 24. Sidewall spacers 32 are arranged adjacent to the gate structures 16, 18, 20 at the opposite sidewalls 28, 29 of the respective gate electrodes 22. The sidewall spacers 32 may be may be composed of a low-k dielectric material, such as SiOCN, that is deposited using the gate structures 16, 18, 20 as mandrels and then etched with an anisotropic etching process, such as reactive ion etching.

Semiconductor layers 34 are epitaxially grown from the fin 10 with an epitaxial growth process. In an embodiment, the semiconductor layers 34 may contain silicon-germanium doped during epitaxial growth with a p-type dopant (e.g., boron, aluminum, gallium, and/or indium) that provides p-type electrical conductivity. In an embodiment, the epitaxial semiconductor layers 34 may contain silicon doped during epitaxial growth with an n-type dopant (e.g., phosphorus and/or arsenic) that provides n-type electrical conductivity. Portions of the semiconductor layers 34 are arranged in cavities defined in the fin 10 between the gate structures 16, 18, 20. The semiconductor layers 34 furnish source/drain regions for one or more field-effect transistors formed using the fin 10. As used herein, the term "source/drain region" means a doped region of semiconductor material that can function as either a source or a drain of a field-effect transistor.

Sections of an interlayer dielectric layer 36 are disposed in spaces over the epitaxial semiconductor layers 34. In particular, a section of the interlayer dielectric layer 36 is arranged adjacent to the sidewall 28 of the gate electrode 22 of the gate structure 18, and another section of the interlayer dielectric layer 36 is arranged adjacent to the opposite sidewall 29 of the gate electrode 22 of the gate structure 18. The interlayer dielectric layer 36 may be composed of a dielectric material, such as silicon dioxide, that is deposited and planarized, and that differs in composition from the dielectric material of the sidewall spacers 32.

Figure 3:
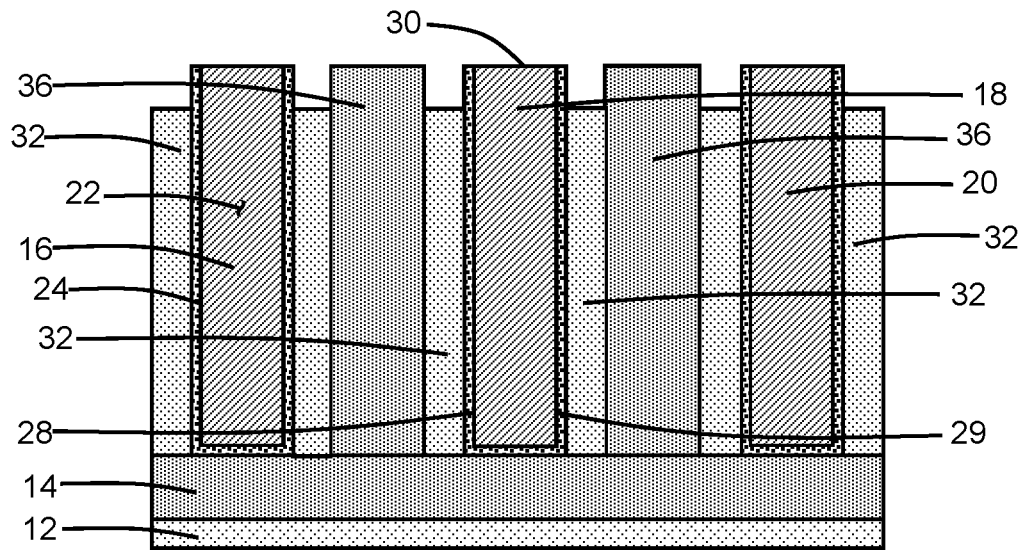
FIGS. 3-11 and 3A-11A are cross-sectional views of the structure at successive fabrication stages of the processing method respectively subsequent to FIGS. 2 and 2A.
Figure 3A:
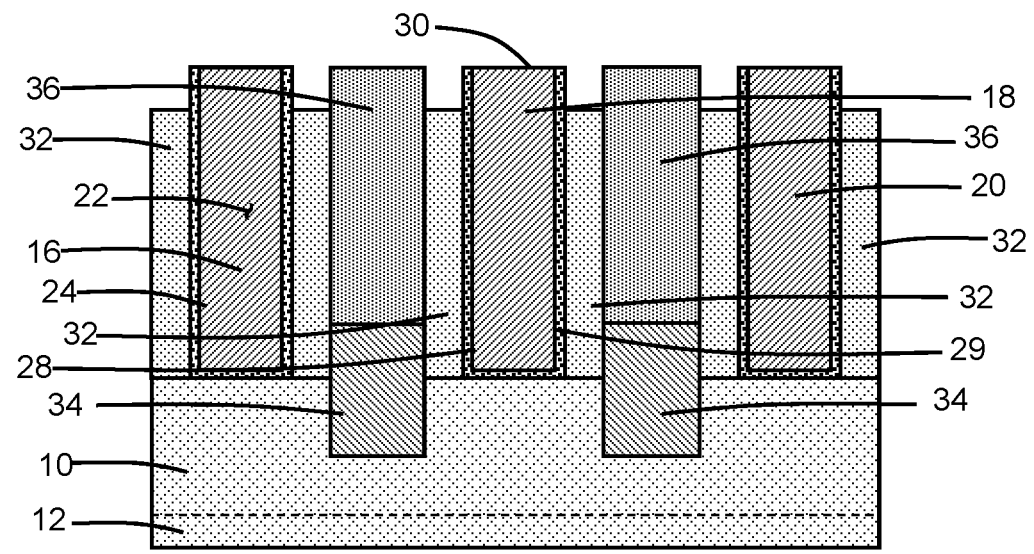

With reference to FIGS. 3 and 3A in which like reference numerals refer to like features in FIGS. 2 and 2A and at a subsequent fabrication stage of the processing method, the sidewall spacers 32 are recessed and pulled down with an etching process. The etching process may include, for example, a reactive ion etching process that removes the material of the sidewall spacers 32 selective to the materials of the gate structures 16, 18, 20 and the interlayer dielectric layer 36. As used herein, the terms "selective" and "selectivity" in reference to a material removal process (e.g., etching) denotes that, with an appropriate etchant choice, the material removal rate (i.e., etch rate) for the targeted material is greater than the removal rate for at least another material exposed to the material removal process. The etching process is self-aligned during its performance due at least in part to the etch selectivity. The partial removal of the sidewall spacers 32 forms shallow recesses between the gate structures 16, 18, 20 and the sections of the interlayer dielectric layer 36. The shallow recesses over the pulled-down sidewall spacers 32 have a given depth in a vertical direction and a given width dimension in a lateral direction that is nominally equal to the thickness of the sidewall spacers 32.

Figure 4:
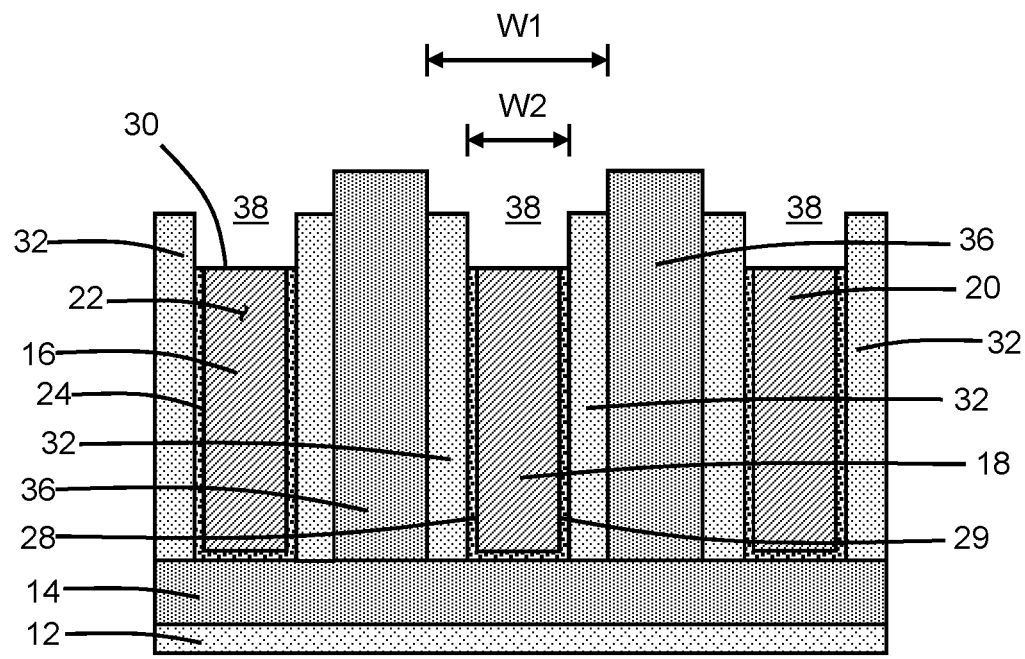
Figure 4A:
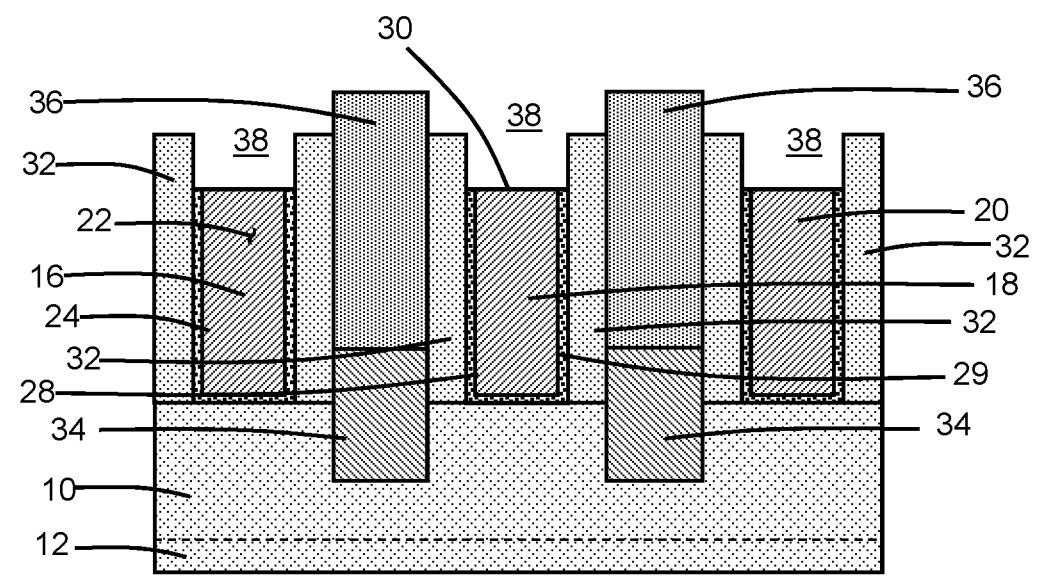

With reference to FIGS. 4 and 4A in which like reference numerals refer to like features in FIGS. 3 and 3A and at a subsequent fabrication stage of the processing method, the gate electrode 22 and gate dielectric layer 24 of the gate structures 16, 18, 20 are recessed relative to the sidewall spacers 32 and the interlayer dielectric layer 36 using one or more selective etching processes. The one or more etching processes are self-aligned during their performance due at least in part to the etch selectivity. After the gate structures 16, 18, 20 are recessed, portions of the sidewall spacers 32 project or extend above the top surface 30 of the gate structures 16, 18, 20. A cavity 38 is defined over each of the gate structures 16, 18, 20 that includes the open space generated by the recessing of the gate structures 16, 18, 20 and the shallow recesses adjacent to the open space that were previously generated by the prior recessing of the sidewall spacers 32 and that merge into the cavity 38.

The gate structures 16, 18, 20 are recessed below the sidewall spacers 32 such that each cavity 38 has sections of multiple widths with a wider upper section arranged over a narrower lower section. The narrower lower section of each cavity 38 has a width dimension, W1, that is approximately equal to the width dimension of the gate structures 16, 18, 20. The wider upper section of each cavity 38 has a width dimension, W2, that is approximately equal to a sum of the width dimension of the gate structures 16, 18, 20 and twice the thickness of the sidewall spacers 32.

In the representative embodiment, the sidewall spacers 32 are recessed before recessing the gate structures 16, 18, 20. In an alternative embodiment, the order may be reversed, and the sidewall spacers 32 may be recessed after recessing the gate structures 16, 18, 20.

Figure 5:
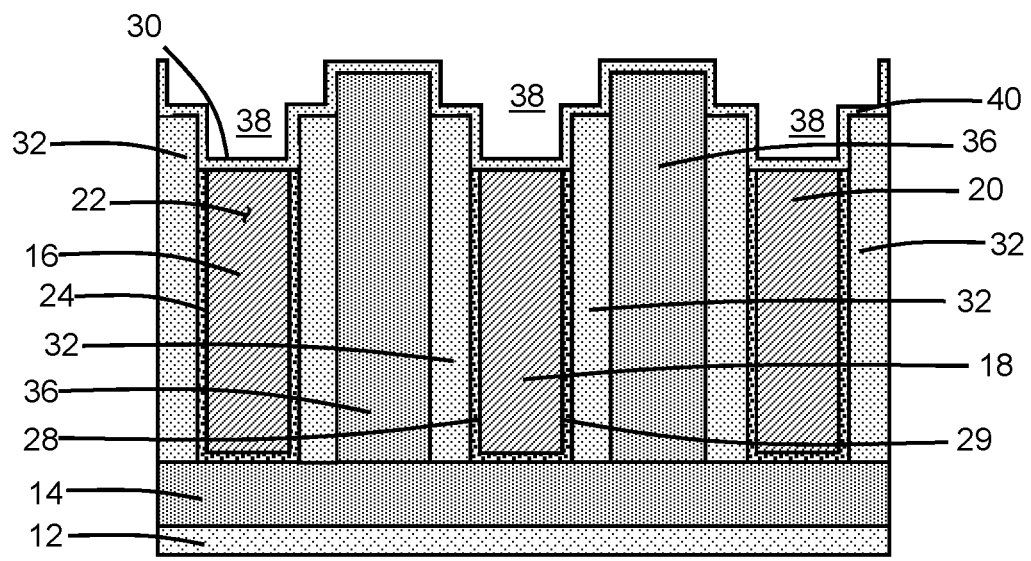
Figure 5A:
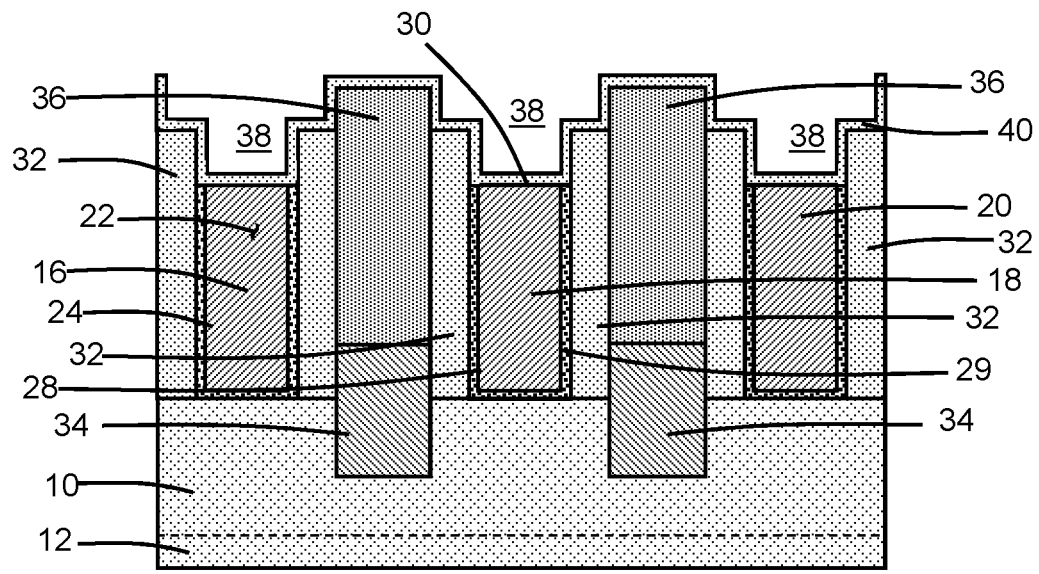

With reference to FIGS. 5 and 5A in which like reference numerals refer to like features in FIGS. 4 and 4A and at a subsequent fabrication stage of the processing method, a dielectric liner 40 is applied that conformally coats the multi-level contour of the surfaces inside the cavities 38 provided by the gate structures 16, 18, 20, the sections of the interlayer dielectric layer 36, and the sidewall spacers 32. The dielectric liner 40 covers the uneven topography and, in particular, includes sections that are arranged over the sections of the interlayer dielectric layer 36. In an embodiment, the dielectric liner 40 may have sections of approximately equal thickness that are arranged inside each cavity 38 and over the sections of the interlayer dielectric layer 36. The dielectric liner 40 may be composed of a layer of a dielectric material, such as aluminum nitride, aluminum oxide, or hafnium oxide, that is deposited by atomic layer deposition. The dielectric material of the dielectric liner 40 may be selected to be removable with an etching process selective to the dielectric material of the sidewall spacers 32, and may be selected to operate as a polish stop as subsequently described.

Figure 6:
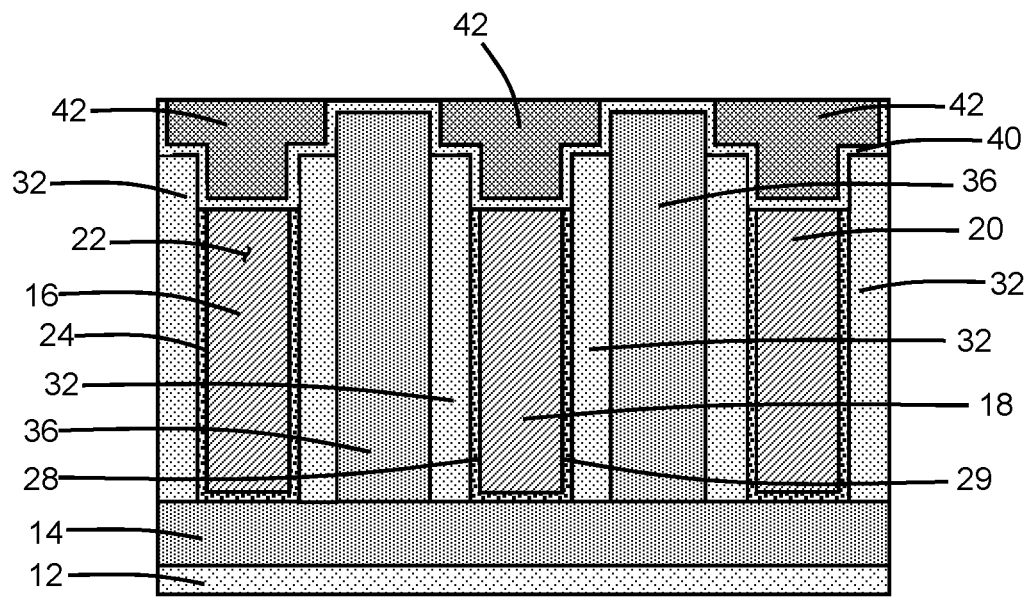
Figure 6A:
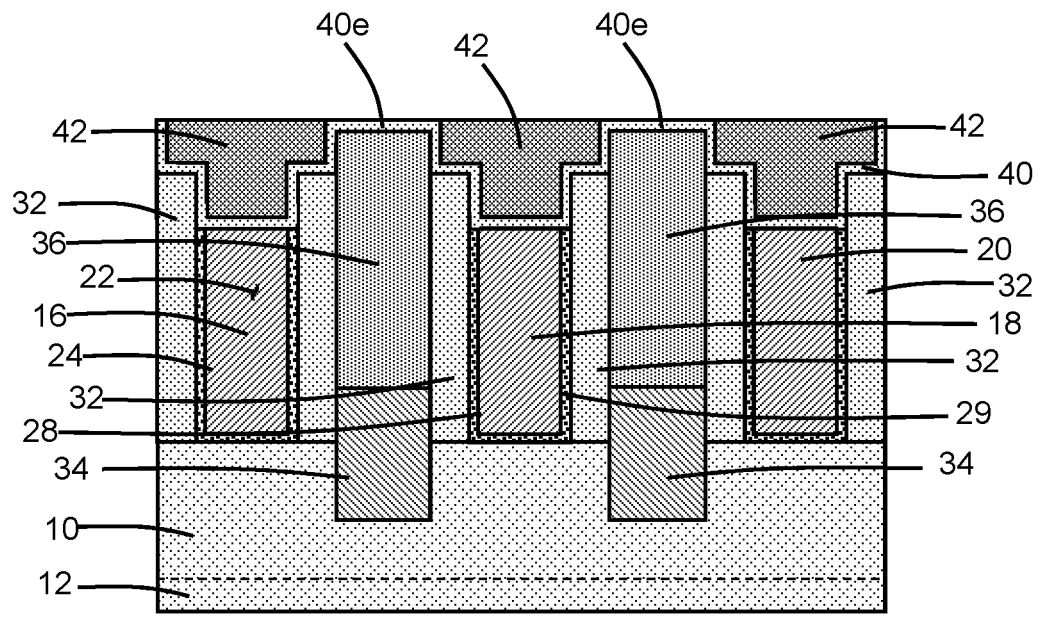

With reference to FIGS. 6 and 6A in which like reference numerals refer to like features in FIGS. 5 and 5A and at a subsequent fabrication stage of the processing method, self-aligned contact caps 42 are formed as gate caps (i.e., dielectric caps) in the widened cavities 38 over the gate structures 16, 18, 20. The self-aligned contact caps 42 may be may be composed of a dielectric material, such as silicon nitride, that is deposited by chemical vapor deposition and then planarized with chemical-mechanical polishing. The dielectric material of the self-aligned contact caps 42 may be selected to be removable with an etching process selective to the dielectric material of the dielectric liner 40. Horizontal sections 40e of the dielectric liner 40 are arranged over the sections of the interlayer dielectric layer 36 and may function as a polish stop during the chemical-mechanical polishing. As a result, the sidewall spacers 32 and the gate structures 16, 18, 20 are protected during the planarization of the self-aligned contact caps 42 and are not eroded by the chemical-mechanical polishing providing the planarization, which contributes to preventing a loss of gate height.

Figure 7:
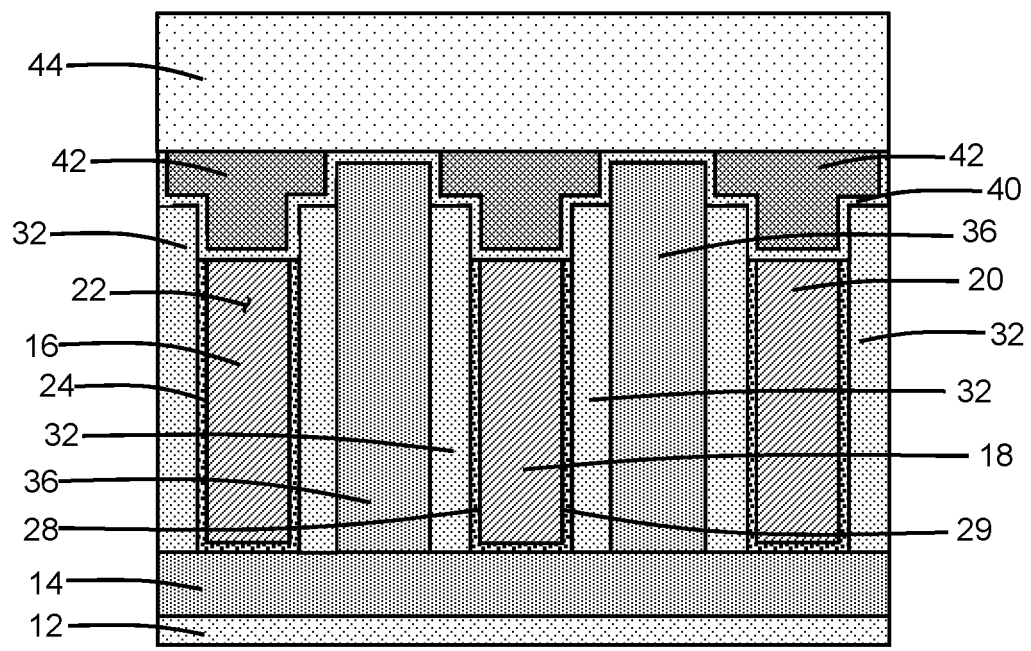
Figure 7A:
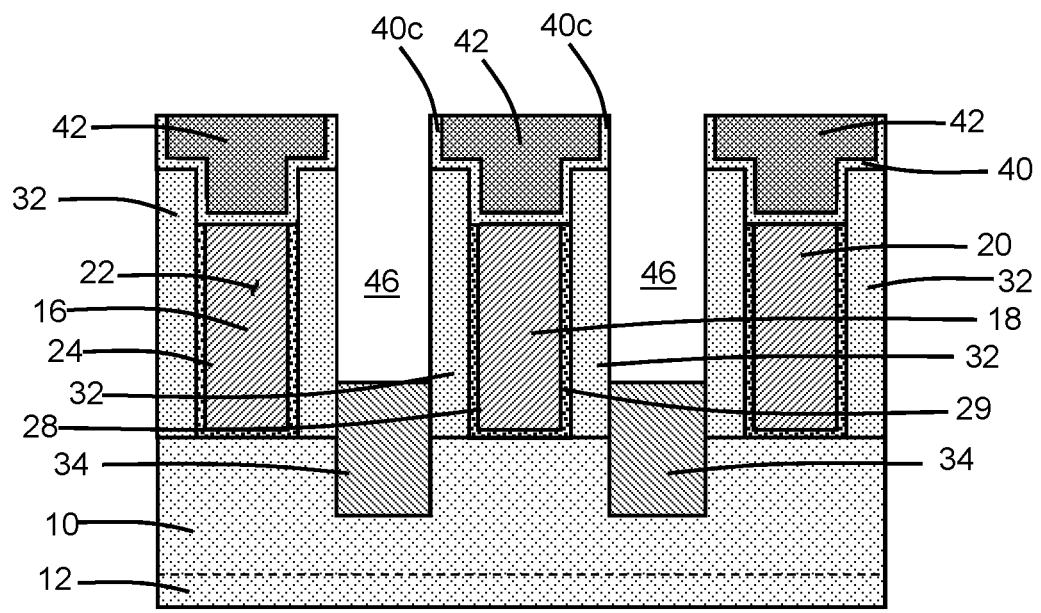

With reference to FIGS. 7 and 7A in which like reference numerals refer to like features in FIGS. 6 and 6A and at a subsequent fabrication stage of the processing method, an etch mask 44 is formed by applying a lithography stack and patterning the lithography stack to expose the dielectric liner 40 over sections of the interlayer dielectric layer 36 and self-aligned contact caps 42 that are located over the fin 10 and semiconductor layers 34. The etch mask 44 may include an organic planarization layer (OPL) material and an anti-reflection coating in the lithography stack that are patterned with lithography and etching processes. The sections of the interlayer dielectric layer 36 exposed by the etch mask 44 and the sections of the dielectric liner 40 over these exposed sections of the interlayer dielectric layer 36 are sequentially removed with one or more etching processes, such as one or more reactive ion etching processes, to form openings 46 that are arranged over the semiconductor layers 34. The etching process removing the exposed sections of the interlayer dielectric layer 36 is self-aligned by the self-aligned contact caps 42. The openings 46 reveal the semiconductor layers 34 for the subsequent formation of source/drain contacts.

The etching process may remove the sections of the interlayer dielectric layer 36 selective to the materials of the dielectric liner 40 and the self-aligned contact caps 42. The vertical sections 40c of the dielectric liner 40 arranged over the sidewall spacers 32 and adjacent to the self-aligned contact caps 42 may function, as part of the self-alignment of the etching process, as a protective etch mask due to the etch selectivity. As a result, portions of the sidewall spacers 32 and the self-aligned contact caps 42 adjacent to the openings 46 are protected during the etching process and are not eroded by the etching process. The etch mask 44 is removed after the openings 46 are formed.

Figure 8:
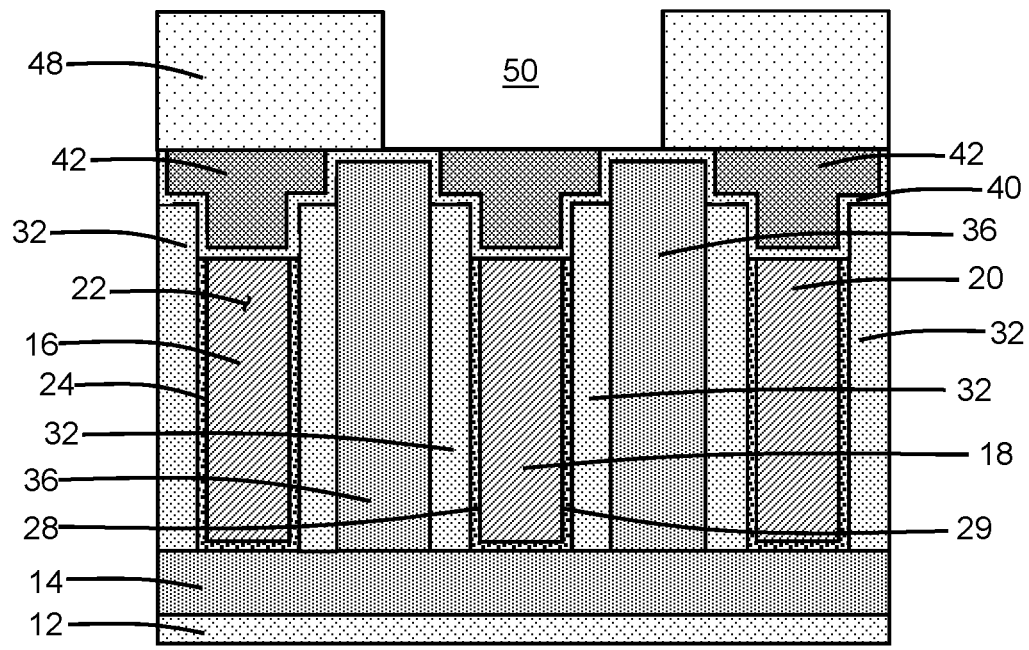
Figure 8A:
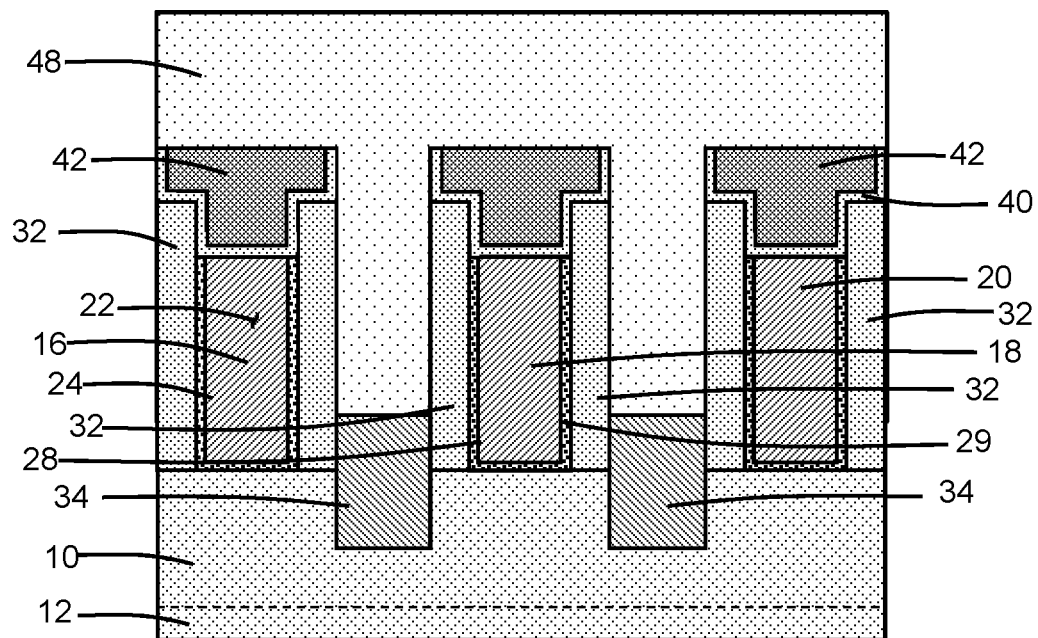

With reference to FIGS. 8 and 8A in which like reference numerals refer to like features in FIGS. 7 and 7A and at a subsequent fabrication stage of the processing method, an etch mask 48 is formed by applying a lithography stack and patterning the lithography stack to define an opening 50 that exposes a section of the self-aligned contact cap 42 over a section of the gate structure 18. Portions of the etch mask 48 fill the previously-formed openings 46 over the semiconductor layers 34. The etch mask 48 may include an organic planarization layer (OPL) material and an anti-reflection coating in the lithography stack that are patterned with lithography and etching processes. The section of the gate structure 18 that is exposed by the opening 50 is arranged over the trench isolation region 14, rather than over the fin 10. The opening 50 may be wider than the self-aligned contact cap 42 so as to overlap with the dielectric liner 40 over the adjacent sections of the interlayer dielectric layer 36.

Figure 9:
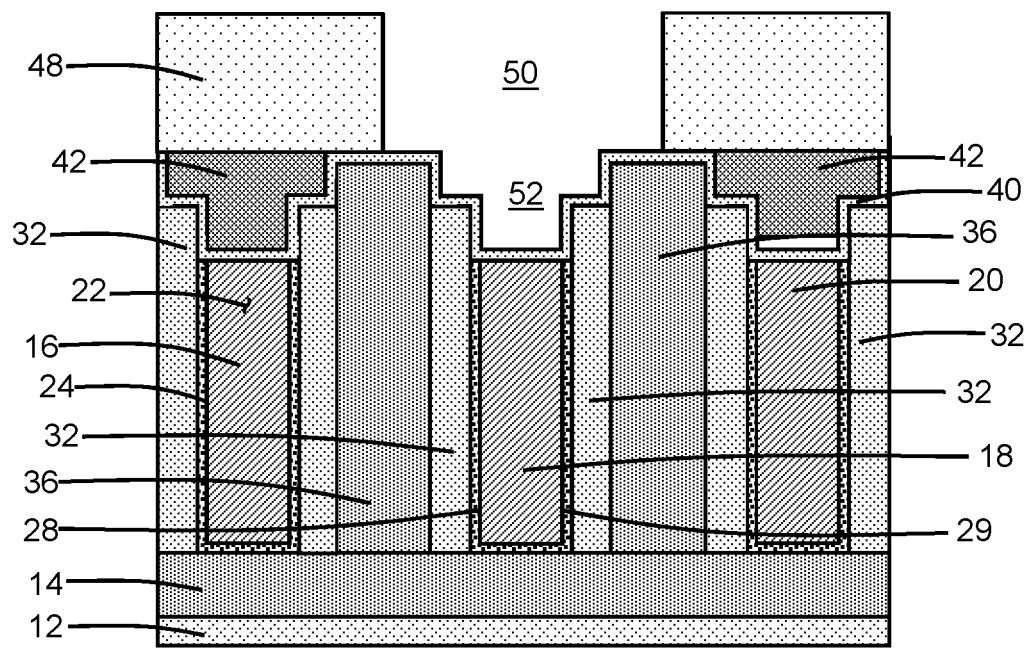
Figure 9A:
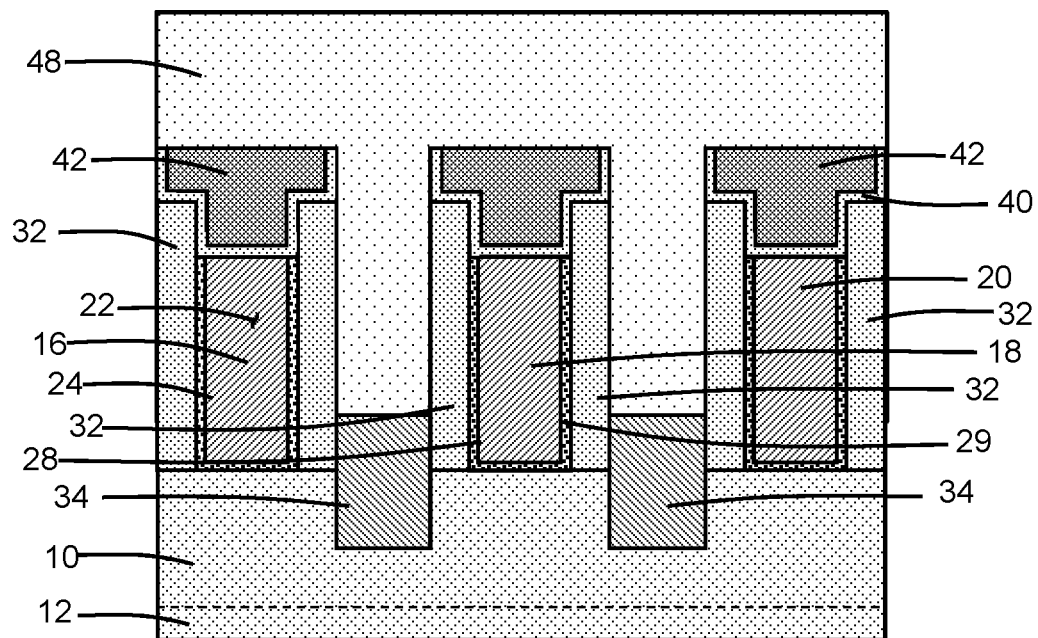

With reference to FIGS. 9 and 9A in which like reference numerals refer to like features in FIGS. 8 and 8A and at a subsequent fabrication stage of the processing method, the section of the self-aligned contact cap 42 over the section of the gate structure 18, which is exposed by the opening 50 in the etch mask 48, is removed by an etching process, such as a reactive ion etching process. The removal of the section of the self-aligned contact cap 42 defines an opening 52 over the section of the gate structure 18. The dielectric liner 40 masks and protects the sidewall spacers 32 and the sections of the interlayer dielectric layer 36 that are located adjacent to the removed section of the gate structure 18. The etching process removes the dielectric material of the self-aligned contact cap 42 selective to the dielectric materials of the sidewall spacers 32 and the interlayer dielectric layer 36. Due to the presence of the sections of the dielectric liner 40, the sidewall spacers 32 and the sections of the interlayer dielectric layer 36 are not etched, and thereby recessed or beveled, during removal of the section of the self-aligned contact cap 42.

Figure 10:
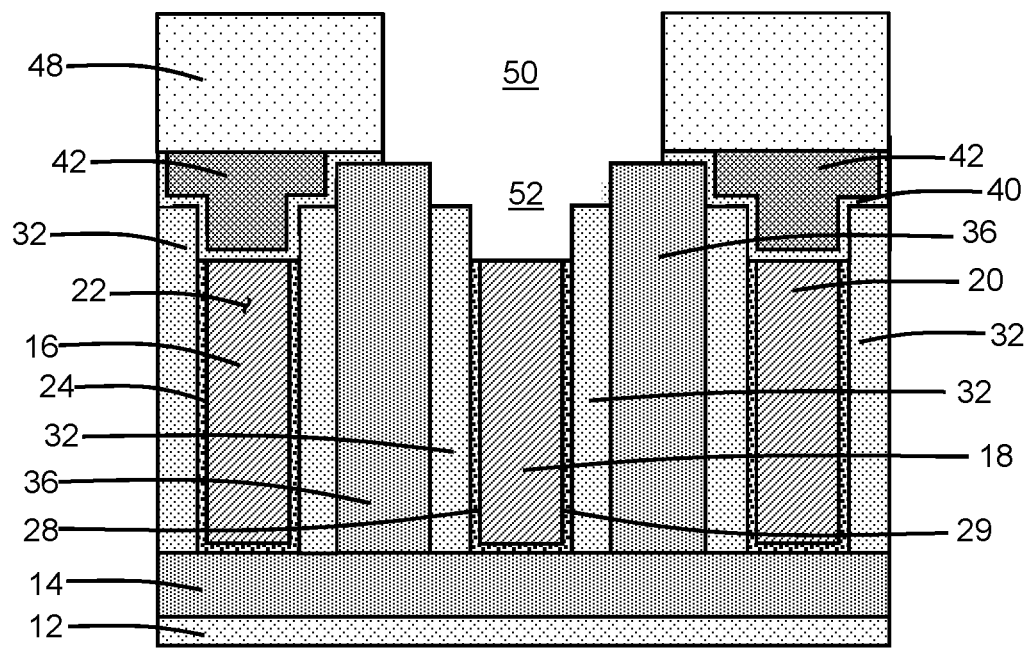
Figure 10A:
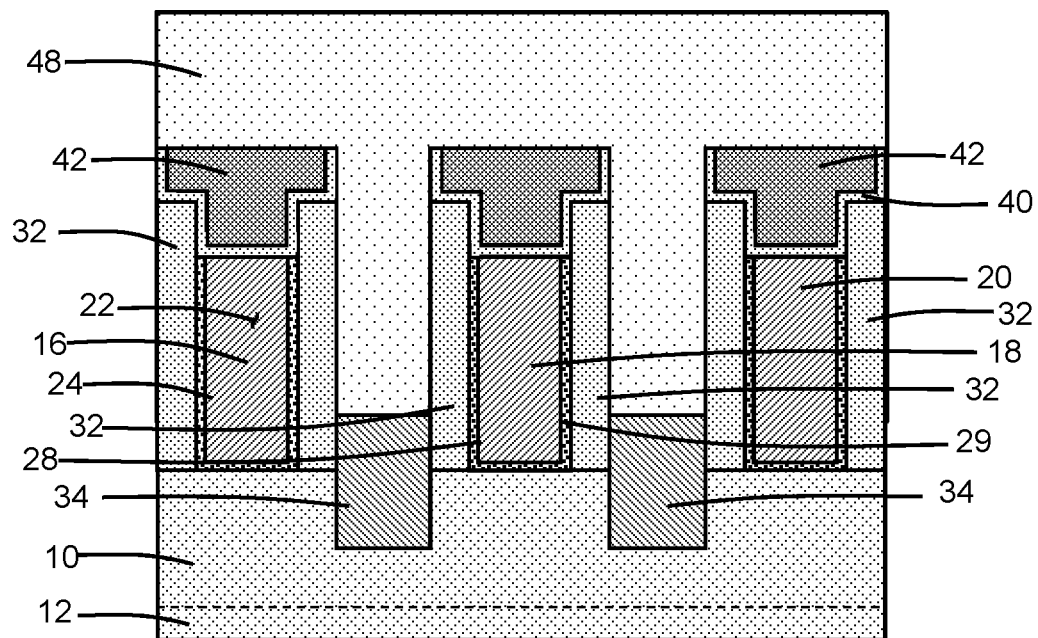

With reference to FIGS. 10 and 10A in which like reference numerals refer to like features in FIGS. 9 and 9A and at a subsequent fabrication stage of the processing method, the dielectric liner 40 is removed from inside the opening 52, which exposes the section of the gate structure 18, as well as the sidewall spacers 32 and sections of the interlayer dielectric layer 36 adjacent to the sidewall spacers 32 and the exposed section of the gate structure 18.

Figure 11:
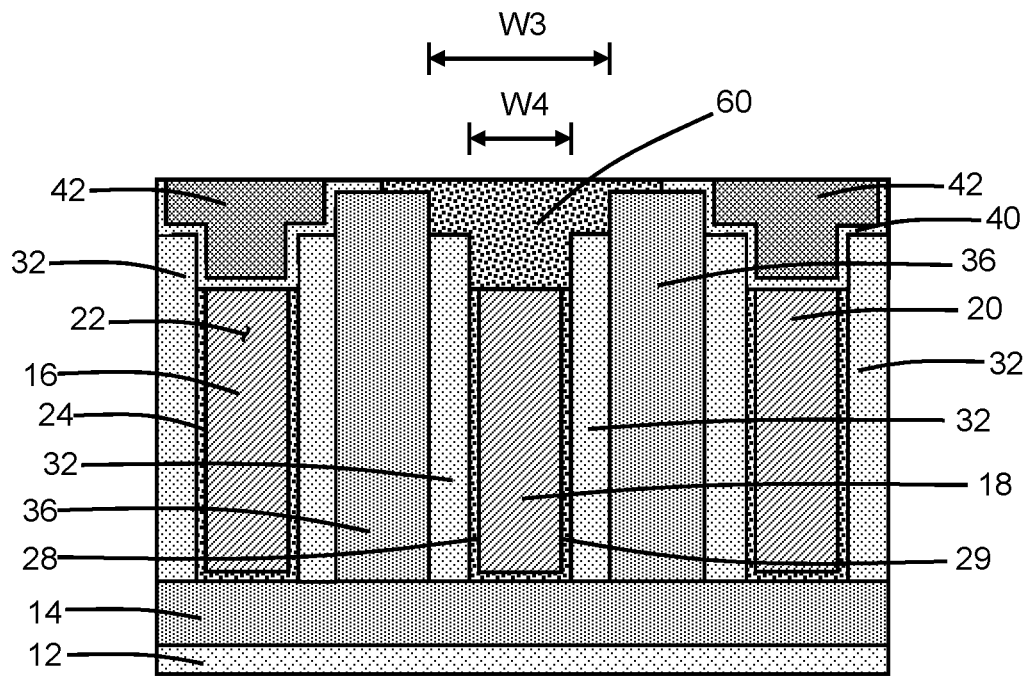
Figure 11A:
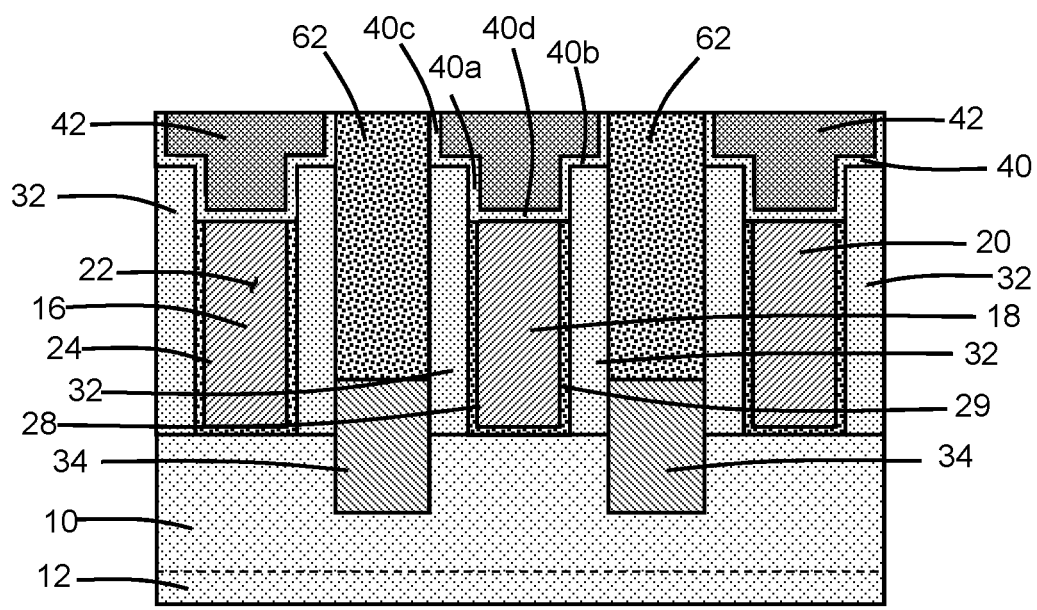

With reference to FIGS. 11 and 11A in which like reference numerals refer to like features in FIGS. 10 and 10A and at a subsequent fabrication stage of the processing method, the etch mask 48 is removed, which reopens the previously-formed openings 46 over the semiconductor layers 34. A gate contact 60 may be formed in the opening 52 over the section of the gate structure 18 exposed by the partial removal of the self-aligned contact cap 42. The gate contact 60 may contain a metal fill layer (e.g., tungsten) deposited by chemical vapor deposition or atomic layer deposition and then planarized by a chemical-mechanical planarization process. Source/drain contacts 62 may be formed in the reopened openings 46 over the semiconductor layers 34. The source/drain contacts 62 may contain a metal silicide layer and a metal fill layer (e.g., tungsten) deposited by chemical vapor deposition or atomic layer deposition and then planarized by a chemical-mechanical planarization process.

The opening 52 is a reopened portion of the cavity 38 (FIGS. 4, 4A), and inherits the multiple widths of the cavity 38 in which a wider upper section is arranged over a narrower lower section. The gate contact 60 conforms to the shape of the opening 52. As a result of the dual widths of the opening 52, the gate contact 60 has a T-shape with a narrower lower section that adopts the shape of the lower section of opening 52 and a wider upper section that adopts the shape of the upper section of the opening 52. The upper section of the gate contact 60 has a width dimension, W3, and the lower section of the gate contact 60 has a width dimension, W4, that is less than the width dimension, W3. In an embodiment, the width dimension, W3, of the gate contact 60 may be approximately equal to the width dimension, W1, of the self-aligned contact cap 42. In an embodiment, the width dimension, W4, of the gate contact 60 may be approximately equal to the width dimension, W2, of the self-aligned contact cap 42.

The dielectric liner 40 includes a section 40a arranged between the sidewall spacer 32 and the narrow lower section of the self-aligned contact cap 42, a section 40b arranged between the sidewall spacer 32 and the wide upper section of the self-aligned contact cap 42, a section 40c that is also arranged between the source/drain contact 62 and the wide upper section of the self-aligned contact cap 42, and a section 40d that is arranged between the gate structure 18 and the self-aligned contact cap 42. The section 40b connects the section 40a with the section 40c, the sections 40a and 40c are oriented in a vertical direction, and the sections 40a and 40d are oriented in a horizontal direction. The different sections 40a-40d (and the removed sections 40e) of the dielectric liner 40 have approximately equal thicknesses.

The gate contact 60 is coupled with a section of the gate structure 18 that is arranged over the trench isolation region 14. The source/drain contacts 62 are arranged over the fin 10 and the epitaxial semiconductor layers 34 adjacent to a different section of the gate structure 18, and the source/drain contacts 62 are displaced along the length (i.e., the longitudinal axis 17 (FIG. 1)) of the gate structure 18 from the gate contact 60. No portion of the gate contact 60 is in direct contact with the dielectric liner 40 due to its removal before forming the gate contact 60.

Figure 12:
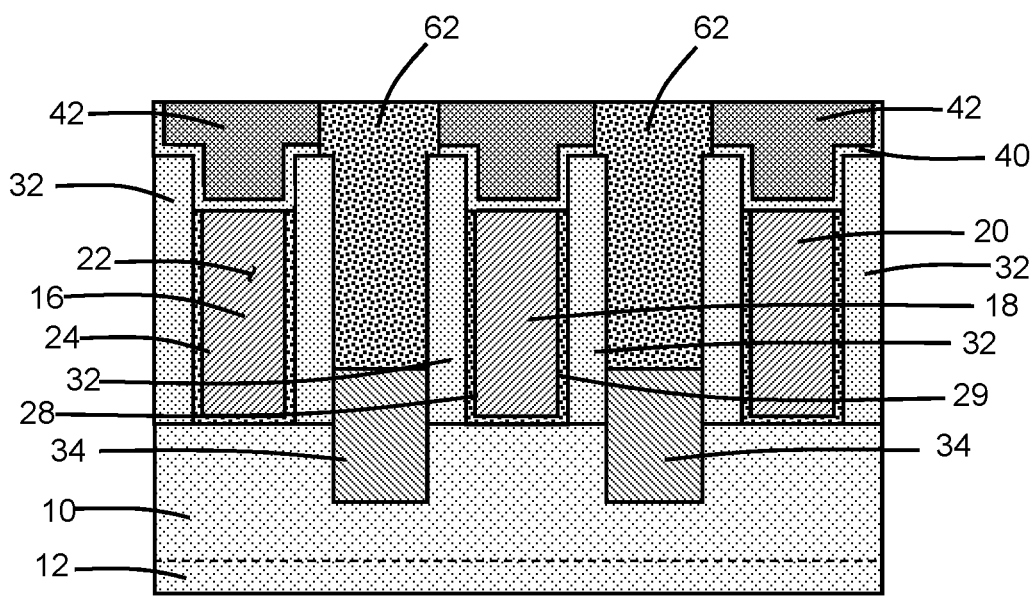
FIG. 12 is a cross-sectional view of a structure in accordance with alternative embodiments of the invention.

With reference to FIG. 12 in which like reference numerals refer to like features in FIG. 11A and at a subsequent fabrication stage of the processing method, the vertical sections 40c of the dielectric liner 40 adjacent to the openings 46 may be removed before forming the source/drain contacts 62. The removal of these sections of the dielectric layer widens the upper portion of each source/drain contact 62, while the lower portion of each source/drain contact 62 retains the original narrower width to provide a T-shape with an enlarged head.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly" on or in "direct contact" with another feature if intervening features are absent. A feature may be "indirectly" on or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first sidewall spacer;
   a second sidewall spacer;
   a gate structure including a gate electrode and a gate dielectric layer that are laterally arranged between the first sidewall spacer and the second sidewall spacer, the gate structure having a top surface recessed relative to the first sidewall spacer and the second sidewall spacer, and the gate structure having a first section and a second section;
   a gate cap arranged over the top surface of the first section of the gate structure, the first sidewall spacer, and the second sidewall spacer, the gate cap having a first section of a first width dimension arranged over the first section of the gate structure and a second section of a second width dimension arranged over the first section of the gate cap, the first sidewall spacer, and the second sidewall spacer;
   a dielectric liner including a first section arranged between the gate cap and the first section of the gate structure, a second section arranged between the gate cap and the first sidewall spacer, and a third section arranged between the gate cap and the second sidewall spacer; and
   a contact coupled with the gate electrode of the second section of the gate structure, the contact having a first section of a first width dimension and a second section of a second width dimension, the first section of the contact arranged over the top surface of the second section of the gate structure, and the second section of the contact arranged over the first section of the contact, the first sidewall spacer, and the second sidewall spacer.

2. The structure of claim 1 wherein the first section of the dielectric liner and the second section of the dielectric liner have approximately equal thicknesses.

3. The structure of claim 1 further comprising:
   an epitaxial semiconductor layer arranged adjacent to the gate structure.

4. The structure of claim 1 wherein the second section of the dielectric liner is arranged to connect the first section of the dielectric liner with the third section of the dielectric liner.

5. The structure of claim 4 wherein the first section and the third section of the dielectric liner are oriented in a first direction, and the second section of the dielectric liner is oriented in a second direction transverse to the first direction.

6. The structure of claim 1 wherein the second width dimension is greater than the first width dimension to define a T-shape.

7. The structure of claim 1 wherein the dielectric liner is comprised of a first dielectric material, and the gate cap is comprised of a second dielectric material selected to be removable with an etching process selective to the first dielectric material.

8. The structure of claim 7 wherein the first sidewall spacer and the second sidewall spacer are comprised of a third dielectric material, and the first dielectric material is selected to be removable with an etching process selective to the third dielectric material.

9. The structure of claim 1 wherein the first width dimension of the gate cap is approximately equal to the first width dimension of the contact, the second width dimension of the gate cap is approximately equal to the second width dimension of the contact, the first section and the second section of the gate structure are arranged along a longitudinal axis, and the contact and the gate cap are aligned along the longitudinal axis.

10. The structure of claim 1 further comprising:
a semiconductor fin,
wherein the first section of the gate structure has an overlapping arrangement with the semiconductor fin.

11. The structure of claim 1 further comprising:
a trench isolation region,
wherein the contact and the second section of the gate structure are arranged over the trench isolation region.

12. The structure of claim 11 further comprising:
a semiconductor fin,
wherein the first section of the gate structure has an overlapping arrangement with the semiconductor fin.

13. The structure of claim 1 wherein the dielectric liner is comprised of aluminum nitride, aluminum oxide, or hafnium oxide.

14. The structure of claim 1 wherein the contact is comprised of tungsten.

15. The structure of claim 1 wherein the first sidewall spacer and the second sidewall spacer are comprised of a low-k dielectric material.

16. The structure of claim 1 wherein the gate cap is comprised of silicon nitride.

* * * * *